United States Patent [19]

Yamamoto

[11] Patent Number: 5,073,472

[45] Date of Patent: * Dec. 17, 1991

[54] LIGHT-SENSITIVE MATERIAL CONTAINING SILVER HALIDE REDUCING AGENT AND POLYMERIZABLE COMPOUND

[75] Inventor: Soichiro Yamamoto, Minami-ashigara, Japan

[73] Assignee: Fuji Photo Film Co., Ltd., Kanagawa, Japan

[*] Notice: The portion of the term of this patent subsequent to Oct. 17, 2006 has been disclaimed.

[21] Appl. No.: 283,033

[22] Filed: Dec. 5, 1988

Related U.S. Application Data

[63] Continuation of Ser. No. 18,660, Feb. 25, 1987, abandoned.

[30] Foreign Application Priority Data

Feb. 26, 1986 [JP] Japan .................. 61-42747

[51] Int. Cl.$^5$ .................. G03C 1/727; G03C 1/733
[52] U.S. Cl. .................. 430/138; 430/620; 430/964
[58] Field of Search .................. 430/138, 620, 964; 503/214, 215; 428/402.2, 402.22, 402.24

[56] References Cited

U.S. PATENT DOCUMENTS

| | | | |
|---|---|---|---|
| 3,396,026 | 8/1968 | Taylor | 430/138 |
| 3,443,948 | 5/1969 | Bryan | 430/138 |
| 3,505,068 | 4/1970 | Beckett et al. | 430/138 |
| 3,694,252 | 9/1972 | Gerber et al. | 430/138 |
| 3,694,253 | 9/1972 | Gerber et al. | 430/138 |
| 4,501,809 | 2/1985 | Hiraishi et al. | 430/138 |
| 4,536,463 | 8/1985 | Sanders | 430/138 |
| 4,576,891 | 3/1986 | Adair et al. | 430/138 |
| 4,579,770 | 4/1986 | Matsushita et al. | 428/213 |
| 4,629,676 | 12/1986 | Hayakawa et al. | 430/203 |
| 4,636,453 | 1/1987 | Keys et al. | 430/138 |

FOREIGN PATENT DOCUMENTS

| | | |
|---|---|---|
| 203613 | 12/1986 | European Pat. Off. . |
| 46-21187 | 6/1971 | Japan . |
| 1180590 | 2/1970 | United Kingdom . |

OTHER PUBLICATIONS

Derwent Japanese Patents Abstracts, vol. 5, No. 23, Jul. 21, 1971, of JP-B-7121187 (Konishiroku Photo).

Conference Record of the 1985 International Display Reference Conference, "Color Electronic Imaging with Mead Microincapsulated Paper", Kollarits et al., pp. 147 and 148.

Photographic Science and Engineering, vol. 6, No. 4, Jul./Aug. 1962, pp. 222–226, Levinos et al., "Photopolymerization Induced by Metal Salts: I. Silver Salts Catalysts".

*Primary Examiner*—Hoa Van Le
*Attorney, Agent, or Firm*—Sughrue, Mion, Zinn, Macpeak & Seas

[57] ABSTRACT

A light-sensitive material comprising a light-sensitive layer provided on a support wherein the light-sensitive layer contains a reducing agent, at least two microcapsules (I) and (II), each of the microcapsules (I) and (II) independently containing silver halide, a polymerizable compound and a color image forming substance, and the microcapsules differing from each other with respect to at least one of the silver halide, the polymerizable compound and the color image forming substance.

4 Claims, No Drawings

LIGHT-SENSITIVE MATERIAL CONTAINING SILVER HALIDE REDUCING AGENT AND POLYMERIZABLE COMPOUND

This is a Continuation of application Ser. No. 07/018,660, filed Feb. 25, 1987, now abandoned.

BACKGROUND OF THE INVENTION

1. Field of the invention

This invention relates to a light-sensitive material comprising a light-sensitive layer containing silver halide, a reducing agent and a polymerizable compound provided on a support.

2. Description of prior arts

Light-sensitive materials comprising a light-sensitive layer containing silver halide, a reducing agent and a polymerizable compound provided on a support can be used in an image forming method in which a latent image of silver halide is formed, and then the polymerizable 5 compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time.

An improved image forming method employing a dry process is described in Japanese Patent Provisional Publication Nos. 61(1986)-69062 and and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

The above-mentioned image forming methods are based on the principle in which the polymerizable compound is polymerized in the portion where a latent image of the silver halide has been formed.

Further, Japanese Patent Provisional Publication No. 61(1986)-260241 describes another image forming method in which the polymerizable compound in a portion where a latent image of the silver halide has not been formed is polymerized. In this method, when the material is heated, the reducing agent functions as polymerization SO inhibitor in the portion where a latent image of the silver halide has been formed, and the polymerizable compound in the other portion is polymerized.

In the light-sensitive materials which may be used for the above-mentioned image forming methods, a color image forming substance can be contained in the light-sensitive layer of the material to form a color image. The light-sensitive material containing the color image forming substance is described in Japanese Patent Provisional Publication No. 61(1986)-73145 (corresponding to U.S. Pat. No. 4,629,676 and European Patent Provisional B Publication No. 0174634A2).

Further, the polymerizable compound and the color image forming substance can be contained in a microcapsule. The light-sensitive material employing the microcapsule is described in Japanese Patent Provisional Publication No. 61(1986)-275742. The light-sensitive material containing such microcapsules has an advantage in that an image improved in sharpness can be obtained.

SUMMARY OF THE INVENTION

An object of the present invention is to provide a light-sensitive material which is easy to adjust the gradation of the obtained image.

Another object of the invention is to provide a light-sensitive material which gives a multicolor image or a full color image.

There is provided by the present invention a light-sensitive material comprising a light-sensitive layer provided on a support wherein the light-sensitive layer contains a reducing agent, at least two microcapsules (I) and (II), each of the microcapsules (I) and (II) independently containing silver halide, a polymerizable compound and a color image forming substance, and the microcapsule (I) differing from the microcapsule (II) with respect to at least one of the silver halide, the polymerizable compound and the color image forming substance.

The light-sensitive material of the invention is characterized in that two or more kinds of the microcapsules are contained in the light-sensitive layer wherein these microcapsules differ from each other with respect to at least one of the silver halide, the polymerizable compound and the color image forming substance.

As a result, these microcapsules differ from each other with respect to the sensitivity to exposure conditions, such as the quantity of light (i.e., the intensity of illumination and the exposure time), the exposure wavelength. Each of the microcapsules independently contains the above components. Therefore, the light-sensitive material of the invention is easy to adjust the gradation of the obtained image by adjusting the exposure conditions in the image formation process.

Further, the light-sensitive material of the invention can give a multicolor image or a full color image by adjusting the spectral sensitivity of the silver halide S as well as the hue of the color image forming substance.

Furthermore, the light-sensitive material of the invention which employs the microcapsules independently containing the above components gives an improved clear image which is reduced in the impurity of the color and has high contrast and improved sharpness.

DETAILED DESCRIPTION OF THE INVENTION

The light-sensitive material of the invention utilizes two or more kinds of the microcapsules which differ from each other with respect to at least one of the silver halide, the polymerizable compound and the color image forming substance. The gradation of the image formed on the light-sensitive material of the invention can be easily controlled by adjusting the exposure condition in the image forming stage.

Where the microcapsules differ with respect to the silver halide, the crystal habit, the halogen composition, the grain size, the grain size distribution and/or other features from each other can be varied. The amount of the silver halide in the microcapsule can be also controlled. Further, the spectral sensitivity of the silver halide can be varied by employing the following spectral sensitizing dye, a chemical sensitizer, a super sensitizer, a stabilizer or an antifoggant.

Where the microcapsules differ with respect to the polymerizable compound, the nature or the amount of the polymerizable compound in the microcapsule can be varied. With respect to the nature of the polymerizable compound, the polymeric nature (e.g., the number of the unsaturated group in the molecule) is preferably varied.

Where the microcapsules differ with respect to the color image forming substance, the hue of the substance is preferably varied. In this case, two or more kinds of the color image forming substances can be incorporated in a microcapsule to adjust the hue.

The reducing agent is preferably contained in each of the microcapsules. The reducing agent can be arranged outside of the microcapsule in the light-sensitive layer, because the reducing agent can permeate the microcapsule in the development process. In the case that the reducing agent is contained in the microcapsule, the microcapsules may differ with respect to the reducing agent, and the nature or the amount of the reducing agent can be varied.

These components of the microcapsule can be arranged either in the core material or in the shell material of the microcapsule.

In the case that the microcapsules differ with respect to both the spectral sensitivity of the silver halide and the hue of the color image forming substance, the hue of the obtained image can be optionally varied according to the exposure condition. Namely, one light-sensitive material of the invention can form a monochromatic image having one color optionally selected in the image formation.

Where three kinds of microcapsules (I), (II) and (III) are employed, these microcapsules respectively contain a cyan color image forming substance, a magenta color image forming substance and a yellow color image forming substance, and the microcapsules differ in the sensitivity of the silver halide, the light-sensitive material can form a multicolor image having the color which is changed according to the quantity of light. The change of the color in the image can be optionally determined in consideration of the sensitivity of the silver halide.

Further, where the above microcapsules (I), (II) and (III) contain silver halides having red sensitivity, green sensitivity and blue sensitivity, respectively, the light-sensitive material can form a full color image according to the known subtractive color process employed in a conventional color photograph. The light-sensitive material of the invention employing the microcapsules can form an improved clear full color image which is reduced in the impurity of the color, because interaction and transference of materials between the neighboring image elements (i.e., microcapsules) are restricted by the microcapsule.

Furthermore, when a microcapsule (IV) which contains a black color image forming substance is employed in addition to the above microcapsules (I), (II) and (III), the light-sensitive material can form an image improved in the area which should have a clear black color, such as a character. This improvement of the black area is possible with the light-sensitive material of the invention because interaction and transference of material between the neighboring image elements (i.e., microcapsules) are restricted by the microcapsule. The black color image forming substance can be composed of two or more color image forming substances. In the case that a gray color is unbalanced in the image formation employing the above microcapsules (I), (II) and (III), the gray color can be corrected by the microcapsule (IV) containing a black color image forming substance composed of two or more substances.

In a system in which the polymerizable compound in the area where the latent image has been formed is polymerized, the sensitivity of the silver halide in the above microcapsule (IV) preferably is higher than each of the sensitivities of the silver halides in other microcapsules. On the other hand, in a system in which the polymerizable compound in the area where the latent image has not been formed is polymerized, the sensitivity of the silver halide in the above microcapsule (IV) preferably is lower.

The light-sensitive material of the invention has various embodiments other than the above mentioned embodiments. The light-sensitive material can employ five or more kinds of microcapsules, and all of the microcapsules is not necessarily defined by the present invention.

The microcapsule containing the silver halide and the polymerizable compound, the reducing agent, and the support which constitute the light-sensitive material of the invention are described below. Thus composed material is referred hereinafter to as "light-sensitive material".

There is no specific limitation with respect to silver halide contained in the light-sensitive layer of the light-sensitive material.

Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048 and European Pat. No. 100,984) can be employed.

There is no specific limitation on the crystal habit of the silver halide grain. Two or more kinds of silver halide grains which differ in halogen composition, crystal habit, grain size, and/or other features from each other can be used in combination. There is no specific limitation on grain size distribution of silver halide grains. The silver halide grains ordinarily have a mean grain (or particle) size of 0.001 to 5 μm, more preferably 0.001 to 2 μm.

The silver content of the silver halide in the light-sensitive layer preferably is not more than 1 g/m², more preferably in the range of from 1 mg/m² to 500 mg/m². The total silver content (including silver halide and an organic silver salt which is one of optional components) in the light-sensitive layer preferably is in the range of from 0.1 mg/m² to 10 g/m², more preferably in the range of from 9 mg/m² to 90 mg/m².

The present inventor has found that a light-sensitive material having a total silver content in the range of from 9 mg/m² to 90 mg/m² gives a clear and stable image. The light-sensitive material having a total silver content of more than 9 mg/m² (more preferably 15 mg/m²) can give a clear and smooth image in which the graininess is indistinctive. The light-sensitive material having the total silver content of less than 90 mg/m² forms a stable image, in which the amount of the residual silver which causes a discoloration, a stain or an impurity of the color in the preservation of the image is sufficiently small.

Further, the light-sensitive material having the total silver content of less than 90 mg/m² has another advantage of leaving an unclear residual image on the light-sensitive layer after the obtained image is transferred to an image-receiving material. It is possible to make the residual image totally unclear by heating or irradiation of light. Therefore, the light-sensitive material having the total silver content of less than 90 mg/m² is preferably used for an image concerning a secret information.

The above mentioned preferable range of the total silver content (9 mg/m² to 90 mg/m²) is preferably adopted in a light-sensitive material employing one kind of the microcapsules. In the light-sensitive material of the invention employing two or more kinds of the microcapsules, the total silver content in the light-sensitive layer more preferably is in the range of from 9×N mg/m² to 45×N mg/m², in which "N" is the number of the kinds of L inventor has further the microcapsules. The present found that as the number of the kinds of the microcapsule increases, the occurrence of a discoloration, a stain or an impurity of the color is reduced. Therefore, no adverse effect is observed when the total silver content is increased to N/2 times in the light-sensitive material employing two or more kinds of the microcapsules.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, S-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamido-5-pyrazolones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound in either a portion where a latent image of the silver halide has been formed or a portion where a latent image of the silver halide has not been formed can be polymerized. In the developing system in which the polymerizable compound in the area where the latent image has not been formed is polymerized, 1-phenyl-3-pyrazolidone is preferably employed as the reducing agent.

The light-sensitive materials employing the reducing agent having these functions (including compounds referred to as developing agent or hydrazine derivative) are described in Japanese Patent Provisional Publication Nos. 61(1986)-183640, 61(1986)-188535 and 61(1986)-228441, and Japanese Patent Application Nos. 60(1985)-210657, 60(1985)-226084, 60(1985)-227527 and 60(1985)-22758. These reducing agents are also described in T. James, "The Theory of the Photographic Process", 4th edition, 291–334 (1977), Research Disclosure No. 17029, 9–15 (June 1978), and Research Disclosure No. 17643, 22–31 (December 1978). The reducing agents described in the these publications and applications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between SO these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)-butyloyl}-2-(p- or o-aminophenyl)-hydrazine pentadecylfluorocaprylate salt, 3-indazolinone, 1-(3,5-dichlorobenzoyl)-2-phenylhydrazine, 1-trityl-2-[}(2-N-butyl-N-octylsulfamoyl)-4-methanesulfonyl}phenyl]hydrazine, 1-}4(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)-butylamide)phenyl]hydrazine, 1-acetyl-2-[4-}2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine and 1-trityl-2-[{2-(N-ethyl-N-octylsulfamoyl)--methanesulfonyl}phenyl]hydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive material of the invention are described in the above-mentioned and later-mentioned publications and applications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds. Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound, are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

There is no specific limitation with respect to the color image forming substance, and various kinds of substances can be employed. Thus, examples of the color image forming substance include both colored substance (i.e., dyes and pigments) and non-colored or almost noncolored substance (i.e., color former or dye- or pigment-precursor) which develops to give a color under applicaition of external energy (e.g., heating, pressing, light irradiation, etc.) or by contact with other components (i.e., developer). The light-sensitive material using the color image forming substance is described in Japanese Patent Provisional Publication No. 61(1986)-73145.

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Specialty Paper" (in Japanese, 1978), 29–58 (pressure-sensitive copying paper), 87–95 (azo-graphy), 118–120 (heat-sensitive color. formation by a chemical change) or in MSS of the seminar promoted by the Society of Kinki Chemical Industry, "The Newest Chemistry of Coloring Matter - Attractive Application and New Development as a Functional Coloring Matter", 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation on preparation of the microcapsules. The light-sensitive material employing a microcapsule is described in Japanese Patent Application No. 60(1985)-117089. There is also no specific limitation on shell material of the microcapsule, and various known materials such as polymers which are used in the conventional microcapsules can be employed as the shell material. The mean size of the microcapsule preferably ranges from 0.5 to 50 μm, more preferably 1 to 25 pm, most preferably 3 to 20 μm.

The light-sensitive material of the invention can be prepared by arranging a light-sensitive layer containing the above-mentioned components on a support. There is no limitation with respect to the support. In the case that heat development is utilized in the use of the light-sensitive material, the material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene).

The light-sensitive layer can further contain optional components such as sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers and binders.

There is no specific limitation with respect to the sensitizing dyes, and known sensitizing dyes used in the conventional art of photography may be employed in the light-sensitive material of the invention. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from to about $10^{-8}$ to about $10^{-2}$ mol per 1 mol of silver halide. O The sensitizing dye is preferably added during the stage of the preparation of the silver halide emulsion. The light-sensitive material wherein the sensitizing dye has been added during the silver halide grain formation is described in Japanese Patent Application No. 60(1985)-139746. The examples of the sensitizing dye are also described in above Japanese Patent Application No. 60(1985)-139746.

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.001 to 1 mol., per 1 mol. of the light-sensitive silver halide. Instead of the organic silver salt, an organic compound (e.g., benzotriazole) which can form an organic silver salt in combination with an inoganic silver salt can be added to the light-sensitive layer to obtain the same effect. The light-sensitive material employing an organic silver salt is described in Japanese Patent Application No. 60(1985)-141799.

Various image formation accelerators are employable in the light-sensitive material of the invention. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, hot-melt solvents, and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); SO ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of B releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

The light-sensitive material employing bases or base precursors is described in Japanese Patent Application No. 60(1985)-22758.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure 26-28 (December 1976). The light-sensitive material employing the hot-melt solvents is described in Japanese Patent Application No. 60(1985)-227527. The hot-melt solvent is preferably used in an amount of from 0.5 to 50% by weight, and more preferably from 1 to 20% by weight, based on the total solid content of the light-sensitive layer.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2.2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound located in a portion where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium oxide or almina described in U.S. Pat. No. 2,711,375. Such particles preferably have a mean size of 3 to 50 $\mu$m, more preferably 5 to 40 $\mu$m. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062.

Examples and usage of the other optional components which can be contained in the light-sensitive layer are also described in the above-mentioned publications and applications concerning the light-sensitive material, and in Research Disclosure Vol. 170, No. 17029, 9–15 (June 1978).

Examples of auxiliary layers which are optionally arranged on the light-sensitive material include an image-receiving layer, a heating layer, an antistatic layer, an anticurl layer and a release layer.

Instead of the use of the image-receiving material, the image-receiving layer can be arranged on the light-sensitive material to produce the desired image on the on the image-receiving layer of the light-sensitive material. The image-receiving layer of the light-sensitive material can be constructed in the same manner as the layer of the image-receiving material. The details of the image-receiving layer will be described later.

The light-sensitive material employing the heating layer is described in Japanese Patent Application No. 60(1985)-135568. Examples and usage of the other auxiliary layers are also described in the above-mentioned publications and applications concerning the light-sensitive material.

The light-sensitive material of the invention can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provision Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, bu is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion as described in Japanese Patent Application No. 60(1986)-139746. When the organic silver salts are introduced in the light-sensitive layer, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide (including the silver halide emulsion), the reducing agent, or the color image forming substances can be dissolved, emulsified or dispersed in the polymerizable compound to prepare the light-sensitive material. Especially, the color image forming substance is preferably incorporated in the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispersed state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The polymerizable compound (including the light-sensitive composition) are preferably emulsified in an aqueous medium to prepare the microcapsule. The necessary components for preparation of the microcapsule, such as shell material can be incorporated into the emulsion. Further, other components such as the reducing agent ca be added to the emulsion.

The emulsion of the polymerizable compound can be processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Patent No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; as in situ process utilizing polymerization of monomers as described in U.K. Patent No. 867,797 and U.S. Pat. No. 4,001,140; an electrolytic dispersion and cooling process as described in U.K. Patent Nos. 952,807 and 965,074; a spray-drying process as described in U.S. Pat. No. 3,111,407 and U.K. Patent 930,422; and the like. It is preferable, though not limitative, that the microcapsule is prepared by emulsifying core materials containing the polymerizable compound and forming a polymeric membrane (i.e., shell) over the core materials.

The dispersion of the two or more kinds of the microcapsules can be used as the coating solution of the light-sensitive material.

A light-sensitive material of the invention can be prepared by coating and drying the above-prepared coating solution on a support in the conventional manner.

Use of the light-sensitive material is described below.

In the use of the light sensitive material of the invention, a development process is conducted simultaneously with or after an imagewise exposure.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Application No. 60(1985)-135568. Heating temperatures for the development process usually ranges from 80° C. to 200° C., and preferably from 100° C. to 160° C. Various heating patterns are applicable. The heating time is usually from 1 second to 5 minutes, and preferably from 5 seconds to 1 minute.

During the above development process, a polymerizable compound in a portion where a latent image of the silver halide has been formed or in a portion where a latent image of the silver halide ha not been formed is polymerized. In a general system, the polymerizable compound in a portion where the latent image has been formed is polymerized. If a nature or amount of the reducing agent is controlled, the polymerizable compound in a portion where the latent image has not been formed can be polymerized in the same manner as the light-sensitive material described in Japanese Patent Provisional Publication No. 61(1986)-260241.

In the above development process, a polymer image can be formed on the light-sensitive layer. A pigment image can be also obtained by fixing pigments to the polymer image.

The image can be also formed on the image-receiving material. The image-receiving material is described hereinbelow. The image forming method employing the image-receiving material or the image-receiving layer is described in Japanese Patent Provisional Publication No. 61(1986)-278849.

Examples of the material employable as the support of the image-receiving material include baryta paper in addition to various examples which can be employed as the support of the known light-sensitive material.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in th art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-sensitive layer is also employable in the image-receiving layer.

The image-receiving layer can be composed of two or more layers according to the above-mentioned functions. The thickness of the image-receiving layer preferably ranges from 1 to 100 μm, more preferably from 1 to 20 μm.

After the development process, by pressing the light-sensitive material to transfer the polymerizable compounds which is still polymerizable to the image-receiving material, a polymer image can be obtained in the image-receiving material. The process for pressing can be carried out in various known manner.

In the case that the light-sensitive layer contains a color image forming substance, the color image forming substance is fixed by polymerization of the polymerizable compound. Then, by pressing the light-sensitive material in contact the image-receiving material to transfer the color image forming substance in unfixed portion, a color image can be produced on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

REFERENCE EXAMPLE 1

Preparation of silver halide emulsion

In 1,000 ml of water were dissolved 20 g of gelatin and 1 g of potassium bromide, and the resulting gelatin solution was kept at 70° C. To the gelatin solution, 600 ml of an aqueous solution containing 70 g of potassium bromide and 600 ml of an aqueous solution containing 0.59 mole of silver nitrate were added simultaneously at the same feed rate over a period of 50 minutes. Further, after 5 minutes, to the resulting mixture, 100 ml of an aqueous solution containing 1.7 g of potassium iodide and 100 ml of an aqueous solution containing 0.01 mole of silver nitrate were added simultaneously at the same feed rate over a period of 5 minutes to obtain a silver iodobromide emulsion having tetradecahedral grains, uniform grain size distribution and a mean grain size of 0.2 μm.

The emulsion was washed for desalting and then subjected to chemical sensitization with 5 mg of sodium thiosulfate and 20 mg of 4-hydroxy-6-methyl-1,3,3a,7-tetraazaindene at 60° C. To the emulsion was added 75 ml of 1% methanol solution of the following sensitizing dye (a) to obtain the silver halide emulsion (A). The yield of the emulsion was 600 g.

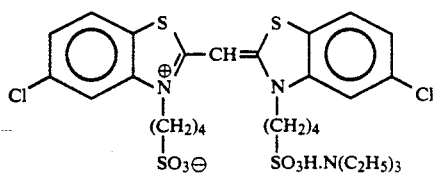

Preparation of silver benzotriazole emulsion

In 3,000 ml of water were dissolved 29 g of gelatin and 13.2 g of benzotriazole, and the solution was kept at 40° C. while stirring. To the solution was added 100 ml of an aqueous solution of 17 g of silver nitrate over 2 min. Excessive salts were sedimented and removed from the resulting emulsion by pH-adjustment. Thereafter, the emulsion was adjusted to a pH of 6.30 to obtain a silver benzotriazole emulsion. The yield of the emulsion was 400 g.

Preparation of light-sensitive composition

In 100 g of trimethylolpropane triacrylate were dissolved 0.2 g of the following copolymer, 12 g of the following color image forming substance (a) and 2 g of Emulex NP-8 (tradename, produced by Nippon Emulsion Co., Ltd.).

(Copolymer)

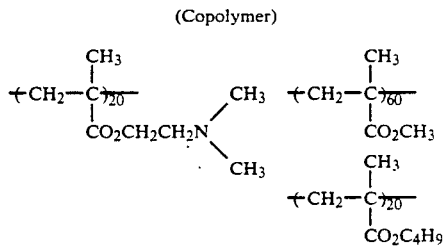

(Color image forming substance (a))

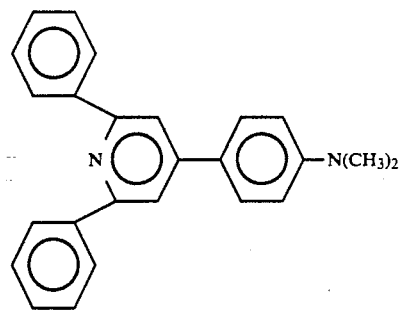

To 18 g of the resulting solution was added a solution in which 0.5 g of the following reducing agent (I) 15 and 0.6 g of the following reducing agent (II) are dissolved in 1.8 g of methylene chloride.

(Reducing agent I)

-continued

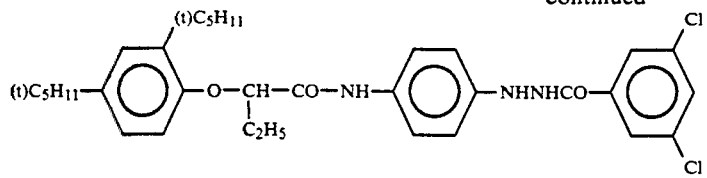

(Reducing agent II)

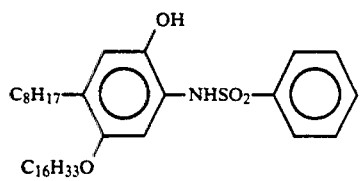

Further, to the resulting solution were added 2 g of the silver halide emulsion (A) and 1 g of the silver benzotriazole emulsion, and the mixture was stirred at 15,000 r.p.m. for 5 min. using a homogenizer to obtain a light-sensitive composition (A).

Preparation of light-sensitive microcapsule

To 10.51 g of 18.6% aqueous solution of Isobam (tradename, produced by Kuraray Co., Ltd.) was added 48.56 g of 2.89% aqueous solution of pectin. After the solution was adjusted to a pH of 4.0 using 10% sulfuric acid, the light-sensitive composition (A) was added to the resulting solution, and the mixture was stirred at 7,000 r.p.m. for 2 min. using a homogenizer to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde, and 2.74 g of 8.76% aqueous solution of ammonium sulfate in this order, and the mixture was heated at 60° C. for 2 hours while stirring. After the mixture was adjusted to a pH of 7.0 using 10% aqueous solution of sodium hydroxide, 3.62 g of 30.9% aqueous solution of sodium hydrogen sulfite was added to the mixture to obtain a dispersion containing light-sensitive microcapsules (A).

Preparation of light-sensitive material

To 10.0 g of the light-sensitive microcapsule dispersion (A) were added 1.0 g of 1% aqueous solution of the following anionic surfactant and 3.0 g of 10% solution (solvent: water/ethanol=50/50 as volume ratio) of guanidine trichroloacetate to prepare a coating solution.

(Anionic surfactant)

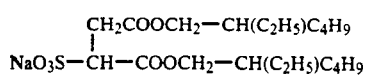

CH₂COOCH₂—CH(C₂H₅)C₄H₉
|
NaO₃S—CH—COOCH₂—CH(C₂H₅)C₄H₉

The coating solution was uniformly coated on a polyethyleneterephthalate film (thickness: 60 μm) to a wet thickness of 70 μm (50 g/m²) and dried at about 40° C. to obtain a light-sensitive material (I).

REFERENCE EXAMPLE 2

Preparation of silver halide emulsion

Silver halide emulsion (B) was prepared in the same manner as in Reference Example 1 except that the sensitizing dye (a) was not added.

Preparation of light-sensitive composition

Light-sensitive composition (B) was prepared in the same manner as in Reference Example 1 except that 2 g of the above silver halide emulsion (B) was used in place of 2 g of silver halide emulsion (A) and 10 g of the following color image forming substance (b) was used in place of 12 g of the color image forming substance (a).

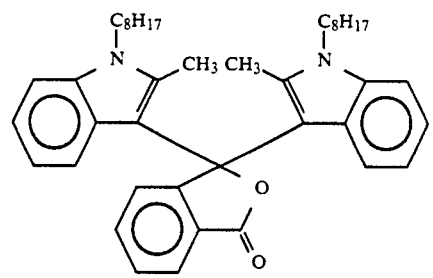

Preparation of light-sensitive microcapsule

Light-sensitive microcapsule dispersion (B) was prepared in the same manner as in Reference Example 1 except that the above light-sensitive composition (B) was used.

Preparation of light-sensitive material

Light-sensitive material (II) was prepared in the same manner as in Reference Example 1 except that 10 g of the above light-sensitive microcapsule dispersion (B) was used in place of 10 g of the light-sensitive microcapsule dispersion (A).

REFERENCE EXAMPLE 3

Preparation of silver halide emulsion

In 1,000 ml of water were dissolved 20 g of gelatin and 1 g of potassium bromide, and the resulting gelatin solution was kept at 60° C. To the gelatin solution, 600 ml of an aqueous solution containing 70 g of potassium bromide and 600 ml of an aqueous solution containing 0.59 mole of silver nitrate were added simultaneously at the same feed rate over a period of 40 minutes. Further, after 5 minutes, to the resulting mixture, 100 ml of an aqueous solution containing 1.7 g of potassium iodide and 100 ml of an aqueous solution containing 0.01 mole of silver nitrate were added simultaneously at the sam feed rate over a period of 5 minutes to obtain a silver iodobromide emulsion having tetradecahedral grains, uniform grain size distribution and a mean grain size of 0.20 μm.

The emulsion was washed for desalting and then subjected to chemical sensitization with 5 mg of sodium thiosulfate and 20 mg of 4-hydroxy-6-methyl-1,3,3a,7-tetraazaindene at 60° C. To the emulsion was added 85 ml of 1% methanol solution of the following sensitizing dye (c) to obtain the silver halide emulsion (C). The yield of the emulsion was 600 g.

(Sensitizing dye (c))

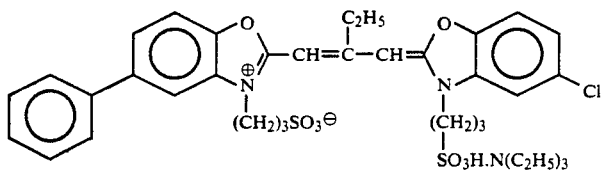

Preparation of light-sensitive composition

Light-sensitive composition (C) was prepared in the same manner as in Reference Example 2 except that 2 g of the above silver halide emulsion (C) was used in place of 2 g of silver halide emulsion (B).

Preparation of light-sensitive microcapsule

Light-sensitive microcapsule dispersion (C) was prepared in the same manner as in Reference Example 1 except that the above light-sensitive composition (C) was used.

Preparation of light-sensitive material

Light-sensitive material (III) was prepared in the same manner as in Reference Example 1 except that 10 g of the above light-sensitive microcapsule dispersion (C) was used in place of 10 g of the light-sensitive microcapsule dispersion (A).

REFERENCE EXAMPLE 4

Preparation of silver halide emulsion

Silver halide emulsion (D) was prepared in the same manner as in Reference Example 3 except that 45 ml of 1% methanol solution of the following sensitizing dye (d) was used in place of 85 ml of 1 % methanol solution of the sensitizing dye (c). w (Sensitizing dye (d))

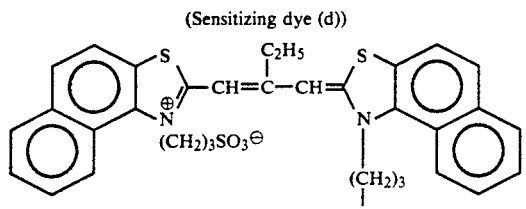

Preparation of light-sensitive composition

Light-sensitive composition (D) was prepared in the same manner as in Reference Example 1 except that 2 g of the above silver halide emulsion (D) was used in place of 2 g of silver halide emulsion (A) and B g of the following color image forming substance (d) was used in place of 12 g of the color image forming substance (a).

(Color image forming substance (d))

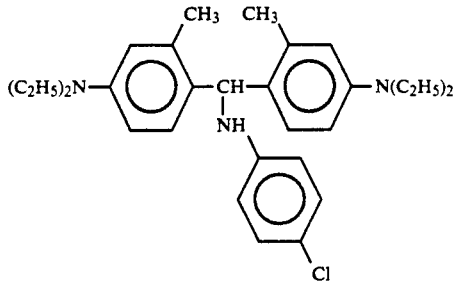

Preparation of light-sensitive microcapsule

Light-sensitive microcapsule dispersion (D) was prepared in the same manner as in Reference Example 1 except that the above light-sensitive composition (D) was used.

Preparation of light-sensitive material

Light-sensitive material (IV) was prepared in the same manner as in Reference Example 1 except that 10 g of the above light-sensitive microcapsule dispersion (D) was used in place of 10 g of the light-sensitive microcapsule dispersion (A).

REFERENCE EXAMPLE 5

Preparation of silver halide emulsion

Silver halide emulsion (E) was prepared in the same manner as in Reference Example 1 except that 85 ml of 1% methanol solution of the sensitizing dye (a) used in Reference Example 1, 75 ml of 1% methanol solution of the sensitizing dye (c) used in Reference Example 3 and 45 ml of 1% methanol solution of the sensitizing dye (d) used in Reference Example 4 were used in place of 75 ml of 1% methanol solution of the sensitizing dye (a).

Preparation of light-sensitive composition

Light-sensitive composition (E) was prepared in the same manner as in Reference Example 1 except that 2 g of the above silver halide emulsion (E) was used in place of 2 g of silver halide emulsion (A) and 10 g of the following color image forming substance (e) was used in place of 12 g of the color image forming substance (a).

(Color image forming substance (e))

-continued

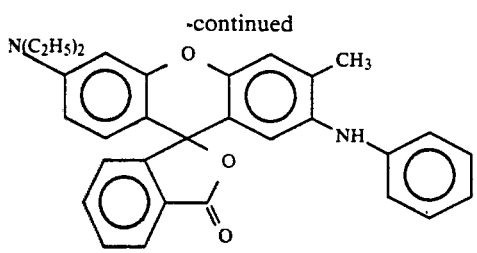

Preparation of light-sensitive microcapsule

Light-sensitive microcapsule dispersion (E) was prepared in the same manner as in Reference Example 1 except that the above light-sensitive composition (E) was used.

Preparation of light-sensitive material

Light-sensitive material (V) was prepared in the same manner as in Reference Example 1 except that 10 g of the above light-sensitive microcapsule dispersion (E) was used in place of 10 g of the light-sensitive microcapsule dispersion (A).

The light-sensitive materials (I) to (V) prepared in Reference Examples 1 to 5 are listed in Table 1.

TABLE 1

| Light-Sensitive Material | Sensitizing Dye | Spectral Sensitivity | Color Image Forming Substance Compound | Hue | Microcapsule |
|---|---|---|---|---|---|
| (I) | (a) | Blue | (a) | Yellow | (A) |
| (II) | — | Blue | (b) | Magenta | (B) |
| (III) | (c) | Green | (c) | Magenta | (C) |
| (IV) | (d) | Red | (d) | Cyan | (D) |
| (V) | (a + c + d) | Panchromatic | (e) | Black | (E) |

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by S coarsely dispersing in a mixer. The coarse dispersion was then finely dispersed in a Dynomile dispersing device. To 200 g of the resulting dispersion were added 6 g of 50% latex of SBR (styrene-butadiene rubber) and 55 g of 8% aqueous solution of polyvinyl alcohol, and the resulting mixture was made uniform.

The mixture was then uniformly coated on an art paper having a weight of 43 g/m² to give a layer having a wet thickness of 30 μm and dried to obtain an image-receiving material.

Evaluation of light-sensitive material

Each of the light-sensitive materials prepared in Reference Examples 1 to 5 was imagewise exposed to light through a filter (wedge) in which the density continuously varied, using a tungsten lamp at 200 lux for 1 second and then heated on a hot plate at 125° C. for 20 seconds. Each of the exposed and heated light-sensitive materials was then combined with the image-receiving material and passed through press rolls under pressure of 500 kg/cm² to obtain a positive color image on the image receiving material. The density of the obtained image was measured using Macbeth reflection densitometer.

The results are set forth in Table 2.

TABLE 2

| Light-Sensitive Material | Spectral Relative Sensitivity | | | Hue in Color Formation |
|---|---|---|---|---|
| | Blue | Green | Red | |
| (I) | 100 | 0 | 0 | Yellow |
| (II) | 35 | 0 | 0 | Magenta |
| (III) | 35 | 100 | 0 | Magenta |
| (IV) | 35 | 0 | 100 | Cyan |
| (V) | 135 | 135 | 135 | Black |

EXAMPLE 1

Preparation of light-sensitive material

Light-sensitive material (VI) was prepared in the same manner as in Reference Example 1 except that a mixture of 5 g of the microcapsule dispersion (A) used in Reference Example 1 and 5 g of the microcapsule dispersion (B) used in Reference Example 2 was used in place of 10 g of the microcapsule dispersion (A).

Evaluation of light-sensitive material

Light-sensitive material (VI) was exposed to light through a monochromatic transparence using a tungsten lamp at varied quantity of light. The exposed light-sensitive material was processed to obtain a positive color image on the image receiving material in the same manner as in Reference Examples. The hue in the obtained image can be optionally changed from red to magenta according to the quantity of light.

EXAMPLE 2

Preparation of light-sensitive material

Light-sensitive material (VII) was prepared in the same manner as in Reference Example 1 except that a mixture of 5 g of the microcapsule dispersion (A) used in Reference Example 1 and 5 g of the microcapsule dispersion (C) used in Reference Example 3 was used in place of 10 g of the microcapsule dispersion (A).

Evaluation of light-sensitive material

Light-sensitive material (VII) was exposed to light through a monochromatic transparence using a tungsten lamp and a filter of varied color from blue to green. The exposed light-sensitive material was processed to obtain a positive color image on the image receiving material in the same manner as in Reference Examples. The hue in the obtained image can be optionally changed from red to magenta according to the color of light.

It is apparent from the results in Examples 1 and 2 that the light-sensitive material of the invention can form a color image which is optionally changed according to the quantity or the color of light.

EXAMPLE 3

Preparation of light-sensitive material

Light-sensitive material (VIII) was prepared in the same manner as in Reference Example 1 except that a mixture of 4 g of the microcapsule dispersion (A) used in Reference Example 1, 3 g of the microcapsule dispersion (C) used in Reference Example 3 and 3 g of the microcapsule dispersion (D) used in Reference Example 4 was used in place of 10 g of the microcapsule dispersion (A).

Evaluation of light-sensitive material

Light-sensitive material (VIII) was exposed to light through a panchromatic transparence using a tungsten lamp. The exposed light-sensitive material was processed to obtain a positive color image on the image receiving material in the same manner as in Reference Examples. Thus, a clear full color image was reproduced on the image receiving material.

EXAMPLE 4

Preparation of light-sensitive material

Light-sensitive material (IX) was prepared in the same manner as in Reference Example 1 except that a mixture of 4 g of the microcapsule dispersion (A) used in Reference Example 1, 3 g of the microcapsule dispersion (B) used in Reference Example 3, 3 g of the microcapsule dispersion (D) used in Reference Example 4 and 2 g of the microcapsule dispersion (E) used in Reference Example 5 was used in place of 10 g of the microcapsule dispersion (A).

Evaluation of light-sensitive material

Light-sensitive material (IX) was exposed to light through a panchromatic transparence including a black character, using a tungsten lamp. The exposed light-sensitive material was processed to obtain a positive color image on the image receiving material in the same manner as in Reference Examples. Thus, a clear full color image was reproduced on the image receiving material and the character was also clearly reproduced.

It is apparent from the results in Examples 3 and 4 that the light-sensitive material of the invention can form a clear full color image.

REFERENCE EXAMPLE 6

Preparation of silver halide emulsion

In 1,000 ml of water were dissolved 20 g of gelatin and 1 g of potassium bromide, and the resulting gelatin solution was kept at 60° C. To the gelatin solution, 600 ml of an aqueous solution containing 70 g of potassium bromide and 600 ml of an aqueous solution containing 0.59 mole of silver nitride were added simultaneously at the same feed rate over a period of 50 minutes. Further, after 5 minutes, to the resulting mixture, 100 ml of an aqueous solution containing 1.7 g of potassium iodide and 100 ml of an aqueous solution containing 0.01 mole of silver nitride were added simultaneously at the same feed rate over a period of 5 minutes to obtain a silver iodobromide emulsion having tetradecahedral grains, uniform grain size distribution and a mean grain size of 0.21 μm.

The emulsion was washed for desalting to obtain the silver halide emulsion (B-2). The yield of the emulsion was 600 g.

Preparation of light-sensitive composition

In 100 g of trimethylolpropane triacrylate were dissolved 0.1 g of the copolymer used in Reference Example 1, 10 g of the color image forming substance (b) used in Reference Example 2 and 0.5 g of Emulex NP-8 (tradename, produced by Nippon Emulsion Co., Ltd.).

To 18 g of the resulting solution was added a solution in which 0.5 g of the reducing agent (I) used in Reference Example 1 and 0.6 of the reducing agent (II) used in Reference Example 1 are dissolved in 1.8 g of methylene chloride.

Further, to the resulting solution were added 3 g of the silver halide emulsion (B-2) and 1 g of the silver benzotriazole emulsion, and the mixture was stirred at 15,000 r.p.m. for 5 min. using a homogenizer to obtain a light-sensitive composition (B-2).

Preparation of light-sensitive microcapsule

To 9.0 g of 20% aqueous solution of Isobam (tradename, produced by Kuraray Co., Ltd.) was added to 50 g of 2.5% aqueous solution of pectin. After the solution was adjusted to a pH of 4.0 using 10% sulfuric acid, the light-sensitive composition (B-2) was added to the resulting solution, and the mixture was stirred at 7,000 r.p.m. for 2 min. using a homogenizer to emulsify the light-sensitive composition in the aqueous medium.

To the aqueous emulsion were added 8.0 g of 40% aqueous solution or urea, 3.0 g of 10% aqueous solution of resorcinol, 8.0 g of 37% aqueous solution of formaldehyde, and 3.0 g of 8.0% aqueous solution of ammonium sulfate in this order, and the mixture was heated at 60° C. for 2 hours while stirring. After the mixture was adjusted to a pH of 7.0 using 10% aqueous solution of sodium hydroxide, 4.0 g of 30% aqueous solution of sodium hydrogen sulfite was added to the mixture to obtain a dispersion containing light-sensitive microcapsules (B-2).

Preparation of light-sensitive material

To 10.0 g of the light-sensitive microcapsule dispersion (B-2) were added 1.0 g of 1% aqueous solution of the anionic surfactant used in Reference Example 1 and 2.0 g of 10% aqueous solution of sodium bicarbonate to prepare a coating solution.

The coating solution was uniformly coated on a polyethyleneterephthalate film (thickness: 60 μm) to a wet thickness of 70 μm (50 g/m²) and dried at room temperature to obtain a light-sensitive material (XI).

REFERENCE EXAMPLE 2

Preparation of light-sensitive material

Each of light-sensitive materials (XII) to (XVIII) was prepared in the same manner as in Reference Example 6 except that amount of the silver halide emulsion (B-2) and amount of the silver benzotriazole emulsion were adjusted according to the following Table 3.

TABLE 3

| Light-Sensitive Material | Silver Halide | Silver Benzotriazole | Total Silver Content |
|---|---|---|---|
| | mg/m² (Based on Silver Content) | | |
| (XI) | 110 | 37 | 147 |
| (XII) | 66 | 22 | 88 |
| (XIII) | 44 | 15 | 59 |
| (XIV) | 25 | 8 | 33 |
| (XV) | 6 | 2 | 8 |
| (XVI) | 88 | 0 | 88 |
| (XVII) | 59 | 0 | 59 |
| (XVIII) | 33 | 0 | 33 |

Evaluation of light-sensitive material

Each of the light-sensitive materials prepared in Reference Examples 6 and 7 was exposed to light through a monochromatic transparence using a tungsten lamp at varying quantity of light and then heated on a hot plate at 125° C. for 10 seconds. Each of the exposed and heated light-sensitive materials was then combined with the image-receiving material and passed through press rolls under pressure of 500 kg/cm² to obtain a magenta positive image on the image receiving material. The density of the obtained image was measured during Macbeth reflection densitometer.

Further, the obtained image on the image receiving material was exposed to light using a fluorescent lamp at 20,000 lux for 1 hour. In the exposed image, the discoloration was evaluated as the change of the density through a blue filter (i.e., increase of yellow color).

Furthermore, the residual image in the light-sensitive layer was macroscopically examined after the image was transferred to the image receiving material.

These results are set forth in Table 4.

TABLE 4

| Light-Sensitive Material | Contrast (Maximum Density - Minimum Density) | Discoloration (Change of Blue Filter) | Residual Image |
| --- | --- | --- | --- |
| (XI) | 1.17 | 0.12 | Clear |
| (XII) | 1.09 | 0.05 | Unclear |
| (XIII) | 1.03 | 0.02 | Unclear |
| (XIV) | 0.86 | 0.00 | Totally Unclear |
| (XV) | 0.23 | 0.00 | Totally Unclear |
| (XVI) | 1.19 | 0.04 | Unclear |
| (XVII) | 1.11 | 0.01 | Unclear |
| (XVIII) | 0.87 | 0.00 | Totally Unclear |

EXAMPLE 5

Preparation of silver halide emulsion

To the silver halide emulsion (B-2) prepared in Reference Example 6 was added 54 ml of 1% methanol solution of the sensitizing dye (a) used in Reference Example 1 to obtain the silver halide emulsion (A-2). The yield of the emulsion was 600 g.

Preparation of light-sensitive composition

Light-sensitive composition (A-2) was prepared in the same manner as in Reference Example 6 except that 3 g of the above silver halide emulsion (A-2) was used in place of 3 g of silver halide emulsion (B-2) and 12 g of the color image forming substance (a) used in Reference Example 1 was used in place of 10 g of the color image forming substance (b).

Preparation of light-sensitive microcapsule

Light-sensitive microcapsule dispersion (A-2) was prepared in the same manner as in Reference Example 6 except that the above light-sensitive composition (A-2) was used.

Preparation of silver halide emulsion

In 1,000 ml of water were dissolved 20 g of gelatin and 1 g of potassium bromide, and the resulting gelatin solution was kept at 55° C. To the gelatin solution, 600 m l of an aqueous solution containing 70 g of potassium bromide and 600 ml of an aqueous solution containing 0.59 mole of silver nitride were added simultaneously at the same feed rate over a period of 40 minutes. Further, after 5 minutes, to the resulting mixture, 100 ml of an aqueous solution containing 1.7 g of potassium iodide and 100 ml of an aqueous solution containing 0.01 mole of silver nitrate were added simultaneously at the same feed rate over a period of 5 minutes to obtain a silver iodobromide emulsion having tetradecahedral grains, uniform grain size distribution and a mean grain size of 0.17 μm.

The emulsion was washed for desalting. To the emulsion was added 62 ml of 1% methanol solution of the sensitizing dye (c) used in Reference Example 3 to obtain the silver halide emulsion (C-2). The yield of the emulsion was 600 g.

Preparation of light-sensitive composition

Light-sensitive composition (C-2) was prepared in the same manner as in Reference Example 6 except that 3 g of the above silver halide emulsion (C-2) was used in place of 3 g of silver halide emulsion (B-2).

Preparation of light-sensitive microcapsule

Light-sensitive microcapsule dispersion (C-2) was prepared in the same manner as in Reference Example 6 except that the above light-sensitive composition (C-2) was used.

Preparation of silver halide emulsion

Silver halide emulsion (D-2) was prepared in the same manner as in the preparation of silver halide emulsion (C-2) except that 41 ml of 1% methanol solution of the sensitizing dye (d) used in Reference Example 4 was used in place of 62 ml of 1% methanol solution of the sensitizing dye (c).

Preparation of light-sensitive composition

Light-sensitive composition (D-2) was prepared in the same manner as in Reference Example 6 except that 3 g of the above silver halide emulsion (D-2) was used in place of 3 g of silver halide emulsion (B-2) and 8 g of the color image forming substance (d) used in Reference Example 4 was used in place of 10 g of the color image forming substance (b).

Preparation of light-sensitive microcapsule

Light-sensitive microcapsule dispersion (D-2) was prepared in the same manner as in Reference Example 6 except that the above light-sensitive composition (D-2) was used.

Preparation of silver halide emulsion

To the silver halide emulsion (B-2) prepared in Reference Example 6 were added 69 ml of 1% methanol solution of the sensitizing dye (a) used in Reference Example 1, 67 ml of 1% methanol solution of the sensitizing dye (c) used in Reference Example 3 and 48 ml of 1% methanol solution of the sensitizing dye (d) used in Reference Example 4 to obtain the silver halide emulsion (E-2). The yield of the emulsion was 600 g.

Preparation of light-sensitive composition

Light-sensitive composition (E-2) was prepared in the same manner as in Reference Example 6 except that 3 g of the above silver halide emulsion (E-2) was used in place of 3 g of silver halide emulsion (B-2) and 10 g of the color image forming substance (e) used in Reference Example 5 was used in place of 10 g of the color image forming substance (b).

Preparation of light-sensitive microcapsule

Light-sensitive microcapsule dispersion (E-2) was prepared in the same manner as in Reference Example 6 except that the above light-sensitive composition (E-2) was used.

Preparation of light-sensitive material

To a mixture of 3.0 g of the microcapsule dispersion (A-2), 3.0 g of the microcapsule dispersion (C-2), 2.0 g of the microcapsule dispersion (D-2) and 2.0 g of the microcapsule dispersion (E-2) were added 1.0 g of 1% aqueous solution of the anionic surfactant used in Reference Example 1 and 2.0 g of 10% aqueous solution of sodium bicarbonate to prepare a coating solution.

The coating solution was uniformly coated (100 g/m$^2$) on a polyethyleneterephthalate film (thickness: 60 μm) and dried at room temperature to obtain the light-sensitive material (XXI).

EXAMPLE 6

Preparation of light-sensitive material

Each of the light-sensitive materials (XXII) to (XVIII) was prepared in the same manner as in Example 5 except that amount of the silver halide emulsion and amount of the silver benzotriazole emulsion were adjusted independently in each of the microcapsule dispersions according to the following Table 5. In the Table 5, each of "Yellow", "Magenta", "Cyan" and "Black" respectively corresponds to each of the adjusted microcapsule dispersions (A-2), (C-2), (D-2) and (E-2) in this order.

TABLE 5

| Light-Sensitive Material | Silver Halide + Silver Benzotriazole mg/m$^2$ (Based on Silver Content) | | | | Total Silver Content |
| --- | --- | --- | --- | --- | --- |
| | Yellow | Magenta | Cyan | Black | |
| (XXI) | 66 + 22 | 66 + 22 | 44 + 15 | 44 + 15 | 294 |
| (XXII) | 40 + 13 | 40 + 13 | 26 + 9 | 26 + 9 | 176 |
| (XXIII) | 26 + 9 | 26 + 9 | 18 + 6 | 18 + 6 | 118 |
| (XXIV) | 13 + 4 | 13 + 4 | 9 + 3 | 9 + 3 | 58 |
| (XXV) | 7 + 2 | 7 + 2 | 4 + 2 | 4 + 2 | 30 |
| (XXVI) | 53 + 0 | 53 + 0 | 35 + 0 | 35 + 0 | 176 |
| (XXVII) | 35 + 0 | 35 + 0 | 24 + 0 | 24 + 0 | 118 |
| (XXVIII) | 17 + 0 | 17 + 0 | 12 + 0 | 12 + 0 | 58 |

Evaluation of light-sensitive material

Each of the light-sensitive materials prepared in Examples 5 and 6 was exposed to light through a panchromatic transparence using a tungsten lamp at varied quantity of light and then heated on a hot plate at 125° C. for 10 seconds. Each of the exposed and heated light-sensitive materials was then combined with the image-receiving material and passed through press rolls under pressure of 350 kg/cm$^2$ to obtain a positive color image on the image receiving material. The contrast and the discoloration in the obtained image without gray area corresponded to the total silver content as same as in the results of Reference Examples 6 and 7.

The obtained image on the image receiving material was exposed to light using a fluorescent lamp at 20,000 lux for 1 hour. In the exposed image, the discoloration in gray area having a medium density was evaluated as the change of the density through a blue filter.

Further, the residual image on the light-sensitive layer was macroscopically examined after the image was transferred to the image receiving material.

These results are set forth in Table 6.

TABLE 6

| Light-Sensitive Material | Discoloration (Change of Blue Filter) | Residual Image |
| --- | --- | --- |
| (XXI) | 0.18 | Clear |
| (XXII) | 0.07 | Unclear |
| (XXIII) | 0.04 | Unclear |
| (XXIV) | 0.00 | Totally Unclear |
| (XXV) | 0.00 | Totally Unclear |
| (XXVI) | 0.06 | Unclear |
| (XXVII) | 0.03 | Unclear |
| (XXVIII) | 0.00 | Totally Unclear |

I claim:

1. A light-sensitive element comprising a support and a light-sensitive layer containing a hydrophilic binder and at least three kinds of microcapsules (I), (II) and (III), each of the microcapsules (I), (II) and (III) containing silver halide, a spectral sensitizing dye, a polymerizable compound having an ethylenic unsaturated group, a reducing agent having a function of reducing the silver halide or a function of accelerating or restraining a polymerization of the polymerizable compound, and a color image forming substance being selected from the group consisting of a dye, a pigment, a dye precursor and a pigment precursor, said silver halide being contained in the light-sensitive layer in such amount that the total silver content is in the range of from 0.1 mg/m$^2$ to 10 g/m$^2$, said spectral sensitizing dye being contained in the light-sensitive layer in the range of 10$^{-8}$ to 10$^{-2}$ mole per 1 mol of silver halide, said polymerizable compound being contained in the light-sensitive layer in an amount of 5 to 1.2×10$^5$ times by weight as much as the amount of silver halide, said reducing agent being contained in the light-sensitive layer in an amount of 0.1 to 1,500 mole % based on the amount of silver, and said color image forming substance being contained in the light-sensitive layer in an amount of from 0.5 to 50 parts by weight per 100 parts by weight of the polymerizable compound, and the microcapsule (I) containing a red sensitive silver halide as the silver halide and a cyan color image forming substance as the color image forming substance, the microcapsule (II) containing a green sensitive silver halide as the silver halide and a magenta color image forming substance as the color image forming substance, and the microcapsule (III) containing a blue sensitive silver halide as the silver halide and a yellow color image forming substance as the color image forming substance.

2. The light-sensitive element as claimed in claim 1, wherein the microcapsules (I), (II) and (III) further contain an organic silver salt.

3. The light-sensitive element as claimed in claim 2, wherein the organic silver salt is contained in the light-sensitive layer in an amount of from 0.01 to 10 mol per 1 mol of the silver halide.

4. The light-sensitive element as claimed in claim 1, wherein the light-sensitive layer further contains a microcapsule (IV) containing silver halide, a polymerizable compound having an ethylenic unsaturated group, a reducing agent having a function of reducing the silver halide or a function of accelerating or restraining a polymerization of the polymerizable compound, and a black color image forming substance.

* * * * *